(12) United States Patent
Wilson et al.

(10) Patent No.: US 7,576,404 B2
(45) Date of Patent: Aug. 18, 2009

(54) BACKLIT PHOTODIODE AND METHOD OF MANUFACTURING A BACKLIT PHOTODIODE

(75) Inventors: Robin Wilson, Co. Down (GB); Conor Brogan, Belfast (GB); Hugh J. Griffin, Co. Antrim (GB); Cormac MacNamara, Belfast (GB)

(73) Assignee: Icemos Technology Ltd., Belfast, Northern Ireland (GB)

( * ) Notice: Subject to any disclaimer, the term of this patent is extended or adjusted under 35 U.S.C. 154(b) by 313 days.

(21) Appl. No.: 11/609,934

(22) Filed: Dec. 13, 2006

(65) Prior Publication Data

US 2007/0138588 A1 Jun. 21, 2007

Related U.S. Application Data

(60) Provisional application No. 60/750,873, filed on Dec. 16, 2005.

(51) Int. Cl.
*H01L 31/062* (2006.01)
(52) U.S. Cl. ............ 257/447; 257/458; 257/460; 257/E31.061
(58) Field of Classification Search ........... 257/443, 257/447, 458, 460, E31.061
See application file for complete search history.

(56) References Cited

U.S. PATENT DOCUMENTS 3,648,131 A 3/1972 Stuby

| | | | |
|---|---|---|---|
| 5,963,785 A * | 10/1999 | Katoh et al. ............ 438/33 |
| 5,994,751 A * | 11/1999 | Oppermann ............ 257/446 |
| 5,998,292 A | 12/1999 | Black et al. |
| 6,087,719 A | 7/2000 | Tsunashima |
| 6,426,991 B1 | 7/2002 | Mattson et al. |
| 6,762,473 B1 | 7/2004 | Goushcha et al. |
| 6,831,367 B2 | 12/2004 | Sekine |
| 2004/0222358 A1* | 11/2004 | Bui et al. ............ 250/214.1 |
| 2006/0027934 A1 | 2/2006 | Edelstein et al. |
| 2007/0085117 A1* | 4/2007 | Wilson et al. ............ 257/291 |

FOREIGN PATENT DOCUMENTS

WO 2005001941 A2 1/2005
WO 2005031880 A1 4/2005

* cited by examiner

*Primary Examiner*—Minh-Loan T Tran
(74) *Attorney, Agent, or Firm*—Panitch Schwarze Belisario & Nadel LLP

(57) ABSTRACT

A backlit photodiode array includes a semiconductor substrate having first and second main surfaces opposite to each other. A first dielectric layer is formed on the first main surface. First and second conductive vias are formed extending from the second main surface through the semiconductor substrate and the first dielectric layer. The first and second conductive vias are isolated from the semiconductor substrate by a second dielectric material. A first anode/cathode layer of a first conductivity is formed on the first dielectric layer and is electrically coupled to the first conductive via. An intrinsic semiconductor layer is formed on the first anode/cathode layer. A second anode/cathode layer of a second conductivity opposite to the first conductivity is formed on the intrinsic semiconductor layer and is electrically coupled to the second conductive via.

4 Claims, 4 Drawing Sheets

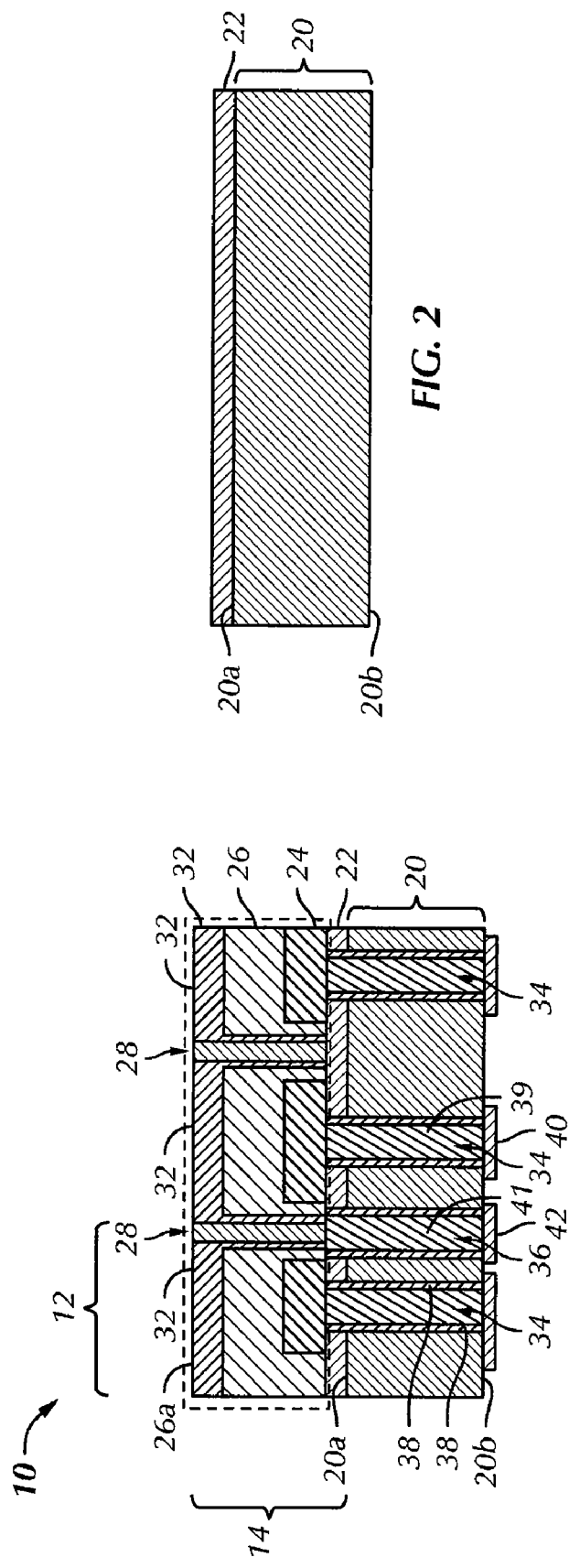

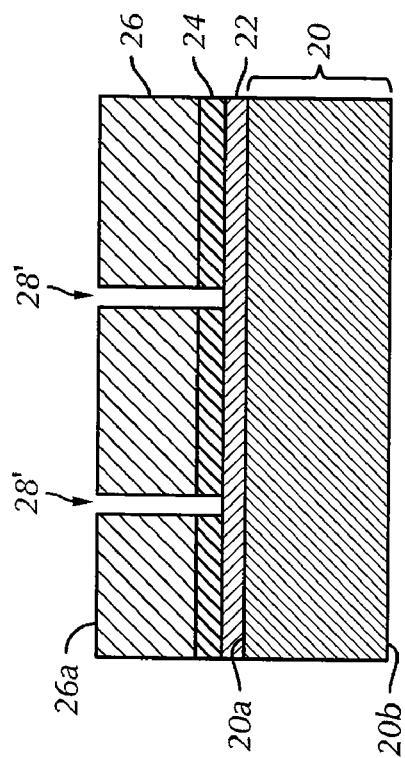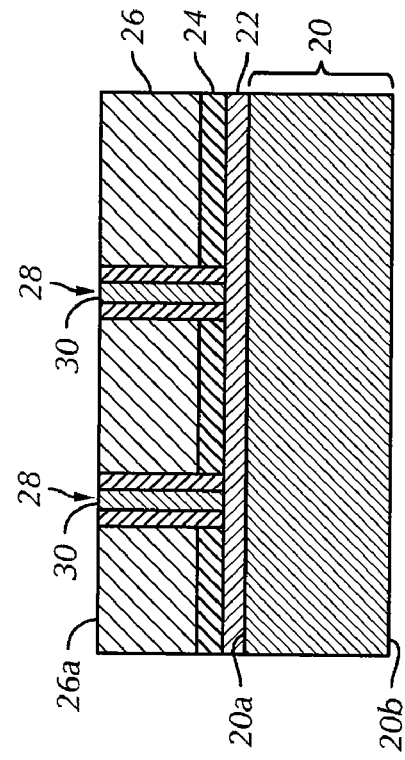
FIG. 3
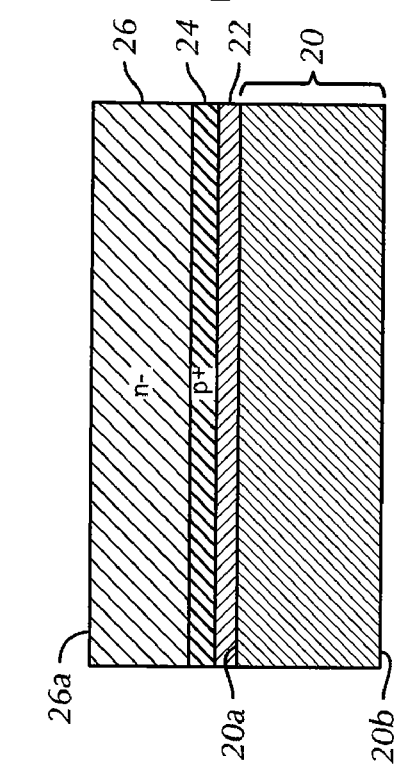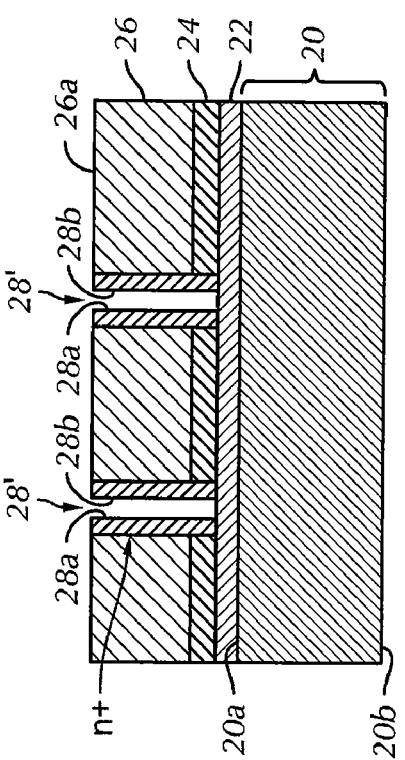
FIG. 4

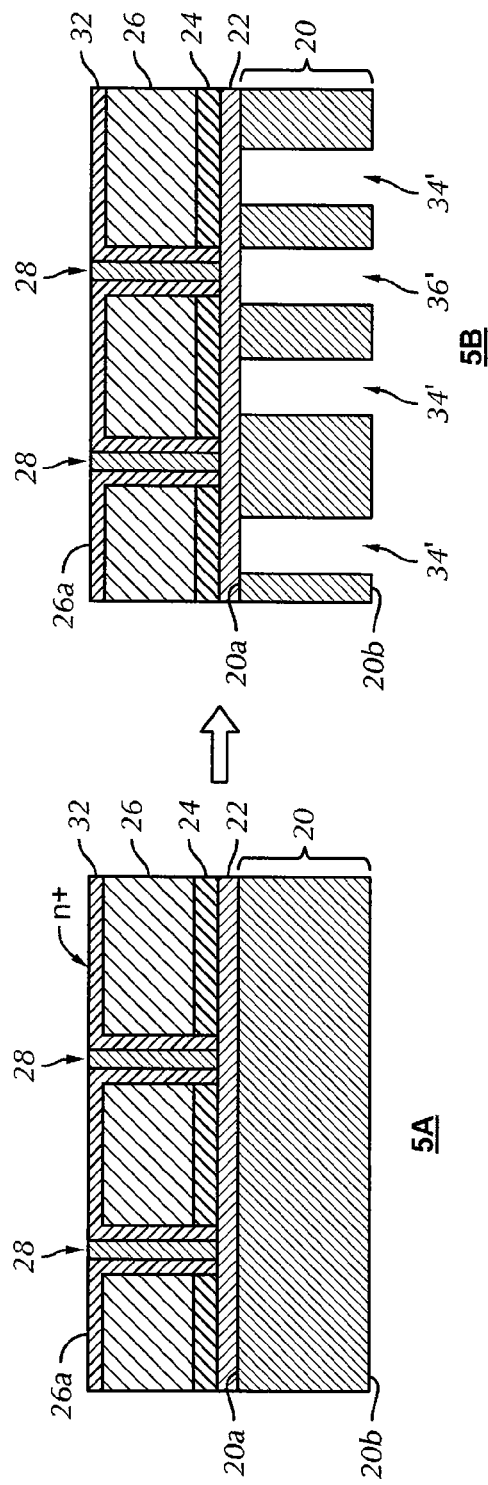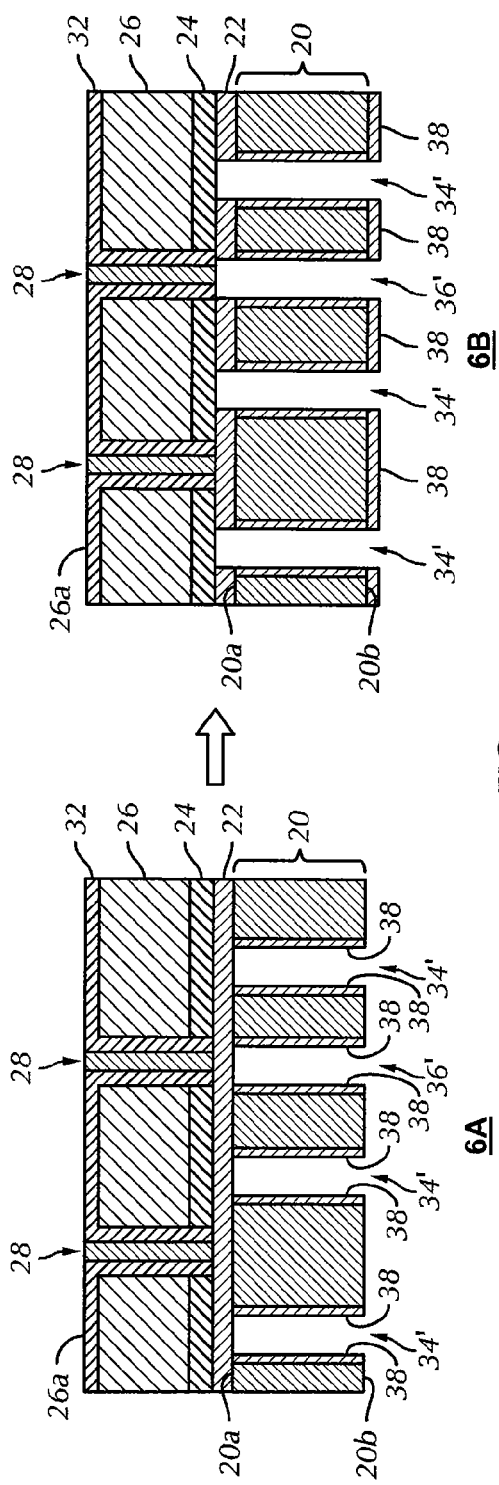

BACKLIT PHOTODIODE AND METHOD OF MANUFACTURING A BACKLIT PHOTODIODE

CROSS-REFERENCE TO RELATED APPLICATIONS

This application claims priority to U.S. Provisional Patent Application No. 60/750,873, filed Dec. 16, 2005, entitled "Backlit Photodiode and Method of Manufacturing a Backlit Photodiode."

BACKGROUND OF THE INVENTION

The present invention relates to a backlit photodiode array, and more particularly, to a backlit photodiode array formed on a silicon on insulator (SOI) substrate having backside contacts.

A photon detector or photodetector (also called a photodiode) is a semiconductor device that converts radiant power or light directly into electrical current. Positive-intrinsic-negative (PIN) diodes or PIN photodiodes are generally known in the art. A PIN/NIP diode is a form of photodetector.

A PIN diode is a type of photodiode with a large, neutrally doped intrinsic region sandwiched between p-doped and n-doped semiconducting regions. The PIN diode's name comes from the layering of the materials positive, intrinsic, negative (PIN). A PIN diode typically exhibits an increase in its electrical conductivity as a function of the intensity, wavelength, and/or modulation rate of the incident radiation.

A PIN diode also operates as a variable resistor at radiofrequency (RF) and microwave frequencies. The resistance value of the PIN diode is determined only by the forward biased direct current (DC) current. At high RF frequencies when a PIN diode is at zero or reverse bias, it appears as a parallel plate capacitor, essentially independent of reverse voltage.

Photoconductor arrays are groups of a plurality of photodetectors, such as PIN/NIP diodes, arranged together on a substrate or wafer.

It is desirable to provide a backlit photodiode array formed on a silicon on insulator (SOI) substrate having backside contacts.

BRIEF SUMMARY OF THE INVENTION

Briefly stated, an embodiment of the present invention comprises a photodiode that includes a semiconductor substrate having first and second main surfaces opposite to each other, a first dielectric layer formed on the first main surface, a first conductive via extending from the second main surface, and a second conductive via extended from the second main surface. The first conductive via extends through the semiconductor substrate and through the first dielectric layer. The first conductive via is isolated from the semiconductor substrate by a second dielectric material. The second conductive via extends through the semiconductor substrate and through the first dielectric layer. The second conductive via is isolated from the semiconductor substrate by the second dielectric material. The photodiode also includes a first anode/cathode layer formed on the first dielectric layer, an intrinsic semiconductor layer formed on the first anode/cathode layer, and a second anode/cathode layer formed on the intrinsic semiconductor layer. The first anode/cathode layer is electrically coupled to the first conductive via, and the first anode/cathode layer is of a first conductivity. The second anode/cathode layer is electrically coupled to the second conductive via, and the second anode/cathode layer is of a second conductivity opposite to the first conductivity.

Another embodiment of the present invention comprises a photodiode array that includes a silicon-on-insulator (SOI) substrate and a photodiode layer. The SOI substrate has first and second main surfaces opposite to each other and a dielectric layer proximate the first main surface. The photodiode layer is formed on the dielectric layer on the first main surface of the SOI substrate. The photodiode has a first anode/cathode layer proximate the dielectric layer and a second anode/cathode layer proximate an exposed surface of the photodiode. At least one anode/cathode via is formed in the photodiode layer proximate the second anode/cathode layer. The at least one anode/cathode via extends to the dielectric layer. First and second conductive vias extend from the second main surface of the SOI substrate and through the SOI substrate and the dielectric layer. The first conductive via is electrically coupled to the first anode/cathode layer and the second conductive via is electrically coupled to the second anode/cathode layer.

Still another embodiment of the present invention comprises a method of manufacturing a photodiode array including providing a silicon-on-insulator (SOI) substrate having first and second main surfaces opposite to each other. The SOI substrate has a dielectric layer proximate the first main surface. A photodiode layer is formed on the dielectric layer on the first main surface of the SOI substrate. The photodiode layer has a first anode/cathode layer proximate the dielectric layer and a second anode/cathode layer proximate an exposed surface of the photodiode. At least one anode/cathode trench is formed in the photodiode layer proximate the second anode/cathode layer. The at least one anode/cathode trench extends to the dielectric layer. Sidewalls of the at least one anode/cathode trench are doped. First and second via trenches extend from the second main surface of the SOI substrate and through the SOI substrate and the dielectric layer. A first conductive layer is formed in the first via trench. The first conductive layer is electrically coupled to the first anode/cathode layer. A second conductive layer is formed in the second via trench. The second conductive layer is electrically coupled to the second anode/cathode layer.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 1 is a partial cross-sectional elevational view of a photodiode array formed on a silicon on insulator (SOI) substrate having backside contacts in accordance with a first preferred embodiment of the present invention;

FIG. 2 is a partial cross-sectional elevational view of an SOI substrate for forming the photodiode array of FIG. 1;

FIGS. 3A and 3B are partial cross-sectional elevational views of a partially formed photodiode array showing anode/cathode trenching;

FIGS. 4A and 4B are partial cross-sectional elevational views of the partially formed photodiode array showing trench doping and optional trench refill;

FIGS. 5A and 5B are partial cross-sectional elevational views of the partially formed photodiode array showing surface diffusion and backside via trenching;

FIGS. 6A and 6B are partial cross-sectional elevational views of the partially formed photodiode array showing oxidization of the via sidewalls;

DETAILED DESCRIPTION OF THE INVENTION

Figure 7:
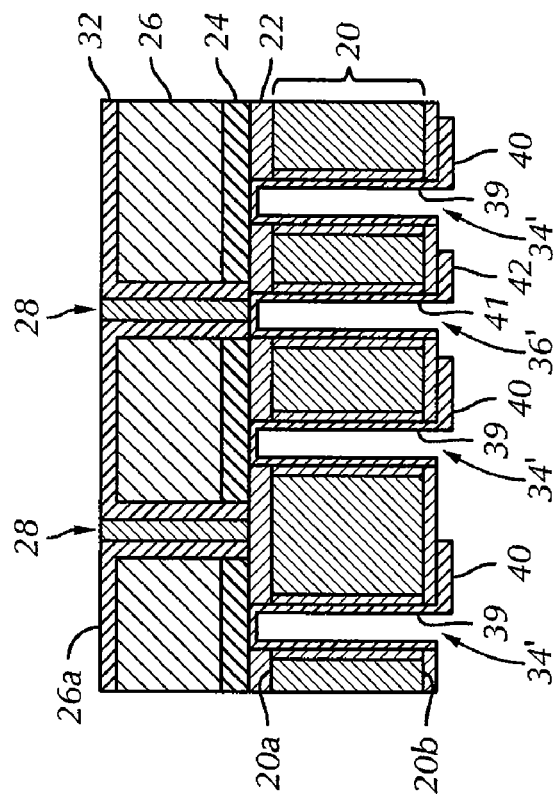
FIG. 7 is a partial cross-sectional elevational view of the partially formed photodiode array showing deposition of metal/metal silicide contacts.

Certain terminology is used in the following description for convenience only and is not limiting. The words "right", "left", "lower", and "upper" designate directions in the drawings to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a" as used in the claims and in the corresponding portion of the specification, means "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, the reference to n or p can also mean that either n and p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Referring to the drawings in detail, wherein like numerals reference indicate like elements throughout, there is shown in FIG. 1 a photodiode array, generally 10, including several photodiodes 12, in accordance with a preferred embodiment of the present invention.

Each photodiode 12 includes a semiconductor substrate 20 having first and second main surfaces 20a and 20b opposite to each other, a first dielectric layer 22 formed on the first main substrate surface 20a, a first conductive via 34, and a second conductive via 36. The first conductive via 34 extends from the second main surface 20b through the semiconductor substrate 20 and through the first dielectric layer 22. The first conductive via 34 is isolated from the semiconductor substrate 20 by a second dielectric material 38. The second conductive via 34 also extends from the second main surface 20b through the semiconductor substrate 20 and through the first dielectric layer 22. The second conductive via 34 is similarly isolated from the semiconductor substrate 20 by the second dielectric material 38. The photodiode 12 also includes a first anode/cathode layer 24 formed on the first dielectric layer 22 and a second anode/cathode layer 32 formed on an intrinsic semiconductor layer 26. The first anode/cathode layer 24 is electrically coupled to the first conductive via 34, and is of a first conductivity. The second anode/cathode layer 32 is electrically coupled to the second conductive via 36, and is of a second conductivity opposite to the first conductivity. More particularly, the photodiode array 10 includes a silicon-on-insulator (SOI) substrate 20. The SOI substrate 20 has a dielectric layer 22 proximate the first main surface 20a. A photodiode layer 14 is formed on the dielectric layer 22 on the first main surface 20a of the SOI substrate 20. The photodiodes 12 each have a first anode/cathode layer 24 proximate the dielectric layer 22 and a second anode/cathode layer 32 proximate an exposed surface 26a of the intrinsic semiconductor layer 26. At least one anode/cathode via 28 is formed in each photodiode 12 proximate the respective second anode/cathode layer 32. The anode/cathode via 28 extends to the dielectric layer 22 of the SOI substrate 20. A plurality of first and second conductive vias 34 and 36 are formed in the second main surface 20b of the SOI substrate 20. The first and second conductive vias 34 and 36 extend through the SOI substrate 20 and the dielectric layer 22. Each of the first conductive vias 34 is electrically coupled to each respective first anode/cathode 24 and the second conductive via 36 is electrically coupled to the second anode/cathode 32.

It should be noted that the first conductivity can be one of p-type and n-type and the second conductivity can be the other one of p-type and n-type without departing from the invention. The photodiodes 12 in the array 10 may be, for example, positive-intrinsic-negative (PIN) diodes or negative-intrinsic-positive (NIP) diodes without departing from the invention. Preferably, the semiconductor substrate 20 is formed of silicon (Si). But, the semiconductor substrate 20 may be formed of other materials such as gallium arsenide (GaAs), germanium (Ge) or the like.

Generally, if a semiconductor crystal contains no impurities, the only charge carriers present are those produced by thermal breakdown of the covalent bonds and the conducting properties are characteristic of the pure semiconductor material. Such a crystal is termed an "intrinsic" semiconductor. When used with reference to a PIN or NIP diode, conventional usage in the art includes lightly doped intrinsic areas. While used herein to refer to the semiconductor substrate or substrate/epitaxial layer as "intrinsic", the present invention recognizes that a photodiode array in accordance with the present invention will work comparably with undoped substrates even when the semiconductor substrate has been lightly doped or even more heavily doped. Accordingly, the term "intrinsic" should not be construed as limiting and the present invention can embrace pure and doped semiconductor substrates formed of various materials.

Figure 8:
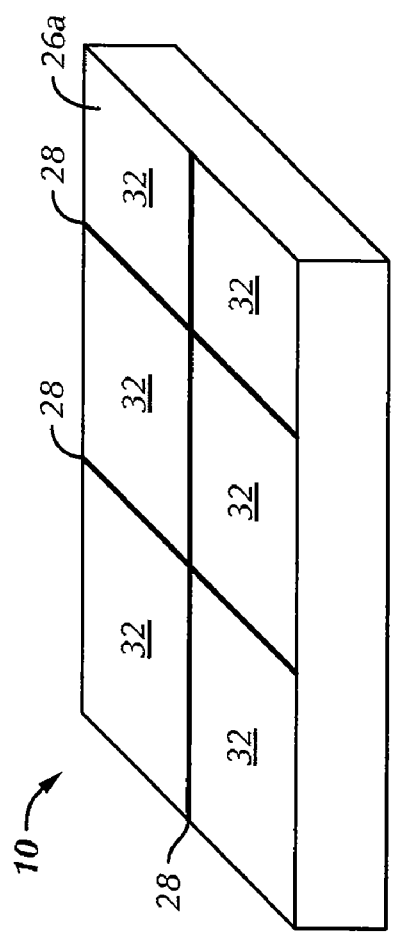
FIG. 8 is a top plan view of the photodiode array of FIG. 1 showing isolation trenches or implants.

Preferably, as shown in FIG. 8, the photodiode array 10 includes a plurality of anode/cathode vias 28 formed in the exposed surface 26a and a plurality of adjacent anodes/cathodes 32 defined by the anode/cathode vias 28. The plurality of anodes/cathodes 32 may be associated with pixels of an image when the photodiode array 10 is used in an imaging application such as X-ray or computed tomography (CT) imaging.

Referring again to FIG. 1, the photodiode array 10 also includes backside contacts 40 and 42 formed on or in contact with the first and second conductive vias 34 and 36 proximate the second main substrate surface 20b.

FIGS. 2-7 depict one possible method of manufacturing the photodiode array 10. The method includes providing a silicon-on-insulator (SOI) substrate 20 having first and second main surfaces 20a and 20b opposite to each other, as shown in FIG. 2. The SOI substrate 20 has a dielectric layer 22 proximate the first main surface 20a. Referring to FIG. 3A, a first anode/cathode layer 24 is formed on the dielectric layer 22 on the first main surface 20a of the SOI substrate 20. An intrinsic semiconductor layer 26 is then formed on the first anode/cathode layer 24. As shown in FIG. 3B, at least one anode/cathode trench, and preferably a plurality of spaced apart anode/cathode trenches 28' are formed in the intrinsic semiconductor layer 26 proximate an exposed surface 26a. The at least one anode/cathode trench 28' extends through the first anode/cathode layer to the dielectric layer 22.

Referring to FIG. 4A, sidewalls 28a and 28b of the at least one anode/cathode trench 28' are doped with a dopant having a conductivity opposite to the conductivity of the first anode/cathode layer 24. Referring to FIG. 4B, the anode/cathode trenches 28' may optionally be refilled with an undoped polysilicon 30 to form anode/cathode via 28. The exposed surface 26a and anode/cathode via 28 can then be planarized to remove excess polysilicon. As shown in FIG. 5A, the exposed surface 26a is doped to form a second anode/cathode layer 32. The dopant is of a conductivity opposite to the conductivity of the first anode/cathode layer 24. It should be noted that the second anode/cathode layer 32 can also be formed before the via trenches 28' are formed.

SOI substrate 20 may be thinned as desired to minimize etch time of via trenches 34' and 36' described below. However, SOI substrate 20 should remain thick enough to maintain sufficient strength. Referring to FIG. 5B, first and second via trenches 34' and 36' are formed in the second main surface of the SOI substrate 20. The first and second via trenches 34' and 36' extend through the SOI substrate 20 to the dielectric layer 22. FIG. 6 shows that the sidewalls of via trenches 34' and 36' are optionally lined with a dielectric material 38, such as an oxide. The via trenches 34' and 36' may then be etched through the first dielectric 22 to the first anode/cathode layer 24 as shown in FIG. 6B. Note that trenches 34' abut the first anode/cathode layer 24 while trenches 36' abut one of the anode/cathode vias 28. Referring to FIG. 7, a first conductive layer 39 is formed in the first via trench 34'. The first conductive layer 39 is electrically coupled to the first anode/cathode 24. A second conductive layer 41 is formed in the second via trench 36'. The second conductive layer 41 is electrically coupled to the second anode/cathode 32. Deposition of metal/metal silicide layers 39 and 41 may serve both as the conductive vias 34 and 36 and the backside contact pads 40 and 42.

Referring to FIG. 8, the anode/cathode vias 28 also serve to isolate the photodiodes 12 from one another. As an alternative to trenching for isolation, doped isolation regions may be utilized. The exposed surface 26a of the photodiode array 10 is selectively masked in order to dope the surface 26a with a second dopant of a third conductivity. The doped isolation regions (in place of vias 28) extend from the exposed surface 28 to at least the first main surface 20a of the semiconductor substrate 20.

The surfaces of the semiconductor substrate 20 and/or the intrinsic semiconductor layer 26 may be smoothed, if needed, using one or more of the following process steps:

(i) an isotropic plasma etch may be used to remove a thin layer of silicon (typically 100-1000 Angstroms (Å)) from the trench surfaces;

(ii) a sacrificial silicon dioxide layer may be grown on the surfaces of the trench and then removed using an etch such as a buffered oxide etch or a diluted hydrofluoric (HF) acid etch.

The use of either or both of these techniques can produce smooth trench surfaces with rounded corners while removing residual stress and unwanted contaminates. However, where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

Doping is performed by one of ion implantation, solid diffusion, liquid diffusion, spin-on deposits, plasma doping, vapor phase doping, laser doping or the like. Doping with boron B results in a more p-type region, doping with phosphorus P results in a more n-type region and doping with arsenic Ar results in a more n-type region. Other dopants may be utilized such as antimony Sb, bismuth Bi, aluminum Al, indium In, gallium Ga or the like depending on the material of the intrinsic semiconductor layer 26 and the desired strength of the doping.

The dopants may be applied by diffusion. The intrinsic semiconductor layer 26 is placed in a suitable diffusion chamber at about 700° C. to about 1200° C. proximate to a solid source such as boron or phosphorous. Alternatively, the intrinsic semiconductor layer 26 can be exposed to a liquid source of dopant at about 700° C. to about 1200° C.

Alternatively, the dopants may be implanted. The intrinsic semiconductor layer 26 is implanted with boron B, phosphorus P, arsenic As or the like, at a high energy level in the range of about 40 to 1000 kilo-electronvolts (KeV). Preferably, the energy level is in the range of about 200 to 1000 KeV, but it should be recognized that the energy level should be selected to sufficiently implant the dopant. The second dopant may be boron B, phosphorus P, arsenic Ar or the like. The second anode/cathode layer is the first conductivity. Another drive in step at a temperature of up to 1200° Celsius may be performed for up to 12 hours so that implanted dopant is sufficiently driven into the substrate.

Backside contacts 40 or 42 are formed by sputtering, evaporation and/or electroplating, resulting in the photodiode array 10 shown in FIG. 1. The contacts 40 and 42 may be a metal such as aluminum Al, aluminum silicon Al[% Si], copper Cu, gold Au, silver Ag, titanium Ti, tungsten W, nickel Ni or the like and combinations thereof or may be doped or undoped polysilicon. The contacts 40 and 42 may also be layers of differing metals.

Other processing steps, as are known in the art, may be utilized without departing from the invention.

The bonding process may include annealing the substrates in an annealing furnace at up to 1200° C. for a period of about a few minutes to six hours. Optionally, the bonding steps may include wetting the surfaces of the silicon substrates with a solution such as water ($H_2O$) and hydrogen peroxide ($H_2O_2$) and then pressing the wetted silicon substrates together and drying them prior to annealing at 800-1200° C. Plasma etches are used to remove impure oxides on the surfaces of the silicon substrates to be bonded. All of the other processing steps are then performed to form the photodiode array.

Another method of manufacturing a photodiode array 10 in accordance with a second preferred embodiment of the present invention includes providing a semiconductor substrate 20 having first and second main surfaces 20a and 20b opposite to each other. An oxide layer 22 is formed on the first main surface 20a of the semiconductor substrate 20. An epitaxial layer 24 of the first conductivity is deposited or grown on the oxide layer 22 on the first main surface 20a of the semiconductor substrate 20. The epitaxial growth or deposition may occur in a suitable reaction chamber at a temperature of up to about 1200° C. All of the other processing steps are then performed to form the photodiode array 10.

Accordingly, a photodiode array 10 can be formed from a single substrate that is appropriately doped on both sides; can be formed from multiple substrates that are bonded together and appropriately doped; can be formed from a substrate with a epitaxial growth layer which is suitably doped; or can be formed from a substrate with an epitaxial growth layer wherein the substrate is appropriately doped.

From the foregoing, it can be seen that the present invention is directed to a backlit photodiode diode array formed on an SOI substrate with backside contacts and methods for manufacturing the same. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A photodiode comprising:
    a semiconductor substrate having first and second main surfaces opposite to each other;
    a first dielectric layer formed on the first main surface;
    a first conductive via extending from the second main surface, through the semiconductor substrate and through the first dielectric layer, the first conductive via being isolated from the semiconductor substrate by a second dielectric material;
    a second conductive via extending from the second main surface, through the semiconductor substrate and through the first dielectric layer, the second conductive via being isolated from the semiconductor substrate by the second dielectric material;
    a first anode/cathode layer formed on the first dielectric layer, the first anode/cathode layer being electrically coupled to the first conductive via, the first anode/cathode layer being of a first conductivity;
    an intrinsic semiconductor layer formed on the first anode/cathode layer; and
    a second anode/cathode layer formed on the intrinsic semiconductor layer, the second anode/cathode layer being electrically coupled to the second conductive via, the second anode/cathode layer being of a second conductivity opposite to the first conductivity.

2. The photodiode according to claim 1, wherein the first dielectric layer is an oxide.

3. The photodiode according to claim 1, wherein the first conductivity is one of p-type and n-type and the second conductivity is the other one of p-type and n-type.

4. A photodiode array comprising:
    a silicon-on-insulator (SOI) substrate having first and second main surfaces opposite to each other, the SOI substrate having a dielectric layer proximate the first main surface;
    a photodiode layer formed on the dielectric layer on the first main surface of the SOI substrate, the photodiode layer having a first anode/cathode layer proximate the dielectric layer and a second anode/cathode layer proximate an exposed surface of the photodiode layer;
    at least one anode/cathode via formed in the photodiode layer proximate the second anode/cathode layer, the at least one anode/cathode via extending to the dielectric layer;
    first and second conductive vias extending from the second main surface of the SOI substrate, through the SOI substrate and the dielectric layer, the first conductive via being electrically coupled to the first anode/cathode layer and the second conductive via being electrically coupled to the second anode/cathode layer.

* * * * *